(12) United States Patent  (10) Patent No.: US 7,791,414 B1
van Sprakelaar  (45) Date of Patent: Sep. 7, 2010

(54) LOW VOLTAGE CURRENT FEEDBACK AMPLIFIER WITH NEAR RAIL TO RAIL INPUT COMMON MODE VOLTAGE RANGE

(75) Inventor: Gertjan van Sprakelaar, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 13 days.

(21) Appl. No.: 11/807,120

(22) Filed: May 25, 2007

(51) Int. Cl.
  *H03F 3/45* (2006.01)
(52) U.S. Cl. ..................................... 330/257
(58) Field of Classification Search ......... 330/252–261, 330/297
See application file for complete search history.

(56) References Cited

U.S. PATENT DOCUMENTS

| 4,555,673 | A   |   | 11/1985 | Huijsing et al. |         |
|-----------|-----|---|---------|-----------------|---------|
| 4,570,128 | A   |   | 2/1986  | Monticelli      |         |
| 5,512,859 | A   | * | 4/1996  | Moraveji        | 330/267 |
| 5,907,262 | A   | * | 5/1999  | Graeme et al.   | 330/255 |
| 6,624,696 | B1  |   | 9/2003  | Eschauzier et al.|        |
| 6,724,260 | B2  |   | 4/2004  | Varner et al.   |         |

OTHER PUBLICATIONS

R.J. Widlar, "Low Voltage Techniques", IEEE Journal of Solid-State Circuits, vol. SC-13. pp. 838-846, Dec. 1978.
D. Smith, et al., "Evolution of High-Speed Operational Amplifier Architectures", IEEE Journal of Solid-State Circuits, vol. 29, No. 10, Oct. 1994.
D. F. Bowers, et al., "Recent Developments in Bipolar Operational Amplifiers", Bipolar/BiCMOS Circuits and Technology Meeting, Proceedings pp. 38-45, Sep. 1999.

* cited by examiner

*Primary Examiner*—Robert Pascal
*Assistant Examiner*—Khiem D Nguyen

(57) ABSTRACT

An embodiment of the present invention is directed to a current feedback amplifier. The amplifier is coupleable with a first supply rail and a second supply rail. The current feedback amplifier includes an input stage configurable to provide a first input and a second input for the current feedback amplifier, wherein the first and second inputs are operable to receive input voltages within 800 mV of the first supply rail or the second supply rail. The amplifier further includes a first current mirror coupled with the input stage, a second current mirror coupled with the input stage, and an output stage coupled with the first and second current mirrors. The output stage is operable to provide an output for the current feedback amplifier.

17 Claims, 8 Drawing Sheets

LOW VOLTAGE CURRENT FEEDBACK AMPLIFIER WITH NEAR RAIL TO RAIL INPUT COMMON MODE VOLTAGE RANGE

BACKGROUND

1. Field

Embodiments of the present invention generally relate to the field of current feedback amplifiers.

2. Background

Current feedback amplifiers (CFAs) offer excellent performance, especially in terms of slew-rate and bandwidth, and are widely used in a number of high speed applications. However, one drawback of conventional CFA topology is the poor input common mode voltage range (CMVR). For example, due to architectural limitations, conventional CFAs are not able to operate properly at input voltages that are at or near the supply rails. In other words, conventional CFAs do not have "rail to rail" input stages, which limits application of CFAs to relatively high supply voltage ($\geq$5V).

The CMVRs of conventional input topologies are limited to at least two base emitter voltages ($V_{be}$, approximately 700 mV each) plus two saturation voltages ($V_{sat}$, approximately 200 mV each). For example, FIG. 1 illustrates one conventional input stage topology 100 that employs a complementary cascaded emitter follower stage. As illustrated in FIG. 1, the CMVR with respect to the input +In is limited by the base-emitter voltage of Qcp1 and the saturation collector-emitter voltage of Qbp1 with respect to the positive supply rail VCC and by the base-emitter voltage of Qcn1 and the saturation collector-emitter voltage of Qbn1 with respect to the negative supply rail VEE. In other words the CMVR of input stage 100 is:

$$\text{CMVR} = V_{CC} - V_{EE} - 2V_{BE} - 2V_{SAT} \quad (1)$$

Thus, in a 5V application, the CMVR of input stage 100 is approximately 3.2V. However, it is appreciated that, depending on component selection, the CMVR may be as much as 3.4V or limited to as little as 2.5V, a loss of roughly half the supply range. It should be appreciated that a similar CMVR may be derived for the −In input of input stage 100.

FIG. 2 illustrates another conventional current feedback amplifier input stage 200 that also employs a complementary emitter follower stage. Similar to FIG. 1, FIG. 2 illustrates that the CMVR of the input +In is reduced by the base-emitter voltage of Q59 and the saturation collector-emitter voltage of Q52 with respect to the positive supply rail VCC and by the base-emitter voltage of Q60 and the saturation collector-emitter voltage of Q55 with respect to the negative supply rail VEE. Thus, the equation for the CMVR of input stage 200 is also expressed in Equation 1 above. Therefore, input stage 200 also experiences the same flaws of prohibitive CMVR limitations at low supply voltages. In FIGS. 1 and 2, the signals vbp and vbn are bias voltages that set up appropriate currents in the transistors connected to these voltages.

Moreover, it should be appreciated that in practice, input stages 100 and 200 also include degeneration resistors (not shown) between the bias current and mirror transistors and the supply rail, which further cut into the CMVR of the input stages 100 and 200. Furthermore, input stages 100 and 200 may be implemented with a MOS architecture, in which case the inputs would require a voltage headroom consisting of a $V_{gs}$ and a $V_{ds,sat}$, roughly 800 mV from each rail.

More recently, input stages have been introduced for current feedback amplifiers that employ a closed-loop buffer as part of the input stage. However, these input stages similarly do not allow for rail to rail CMVR at the inputs of a current feedback amplifier.

Thus, conventional current feedback amplifier technology lacks a true rail to rail input stage.

SUMMARY

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

An embodiment of the present invention is directed to a current feedback amplifier. The amplifier is coupleable with a first supply rail and a second supply rail. The current feedback amplifier includes an input stage configurable to provide a first input and a second input for the current feedback amplifier, wherein the first and second inputs are operable to receive input voltages within 800 mV of the first supply rail or the second supply rail. The amplifier further includes a first current mirror coupled with the input stage, a second current mirror coupled with the input stage, and an output stage coupled with the first and second current mirrors. The output stage is operable to provide an output for the current feedback amplifier.

Thus, embodiments provide for a rail to rail current feedback amplifier. Therefore, current feedback amplifiers according to various embodiments may be suitable for use in low-voltage applications (e.g., less than 5 V) in which current feedback amplifiers previously were not due to CMVR constraints. Moreover, various embodiments are capable of accepting common mode signals that are very near to the rails, while at the same time maintaining the traditional current feedback advantages of high slew rate and flexible AC performance.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Overview

Briefly stated, embodiments provide for rail to rail current feedback amplifiers. As used herein, the term "rail to rail" shall be understood to mean inputting or outputting a voltage up to 200 mV from a supply rail of an amplifier. For example, for supply rails of +5V and −5V, a rail to rail input would be able to input voltages in the range of −4.8V to +4.8V. Thus, embodiments are able to receive and/or output voltages that are within 800 mV of the supply rails, which was previously unattainable in conventional current feedback amplifiers.

Rail to rail performance is achieved using an output stage having a rail to rail output and also using an input stage having rail to rail inputs. In one embodiment, the input stage is a closed loop buffer having a rail to rail input and a rail to rail output.

Exemplary Circuitry, in Accordance with Various Embodiments

Figure 1:
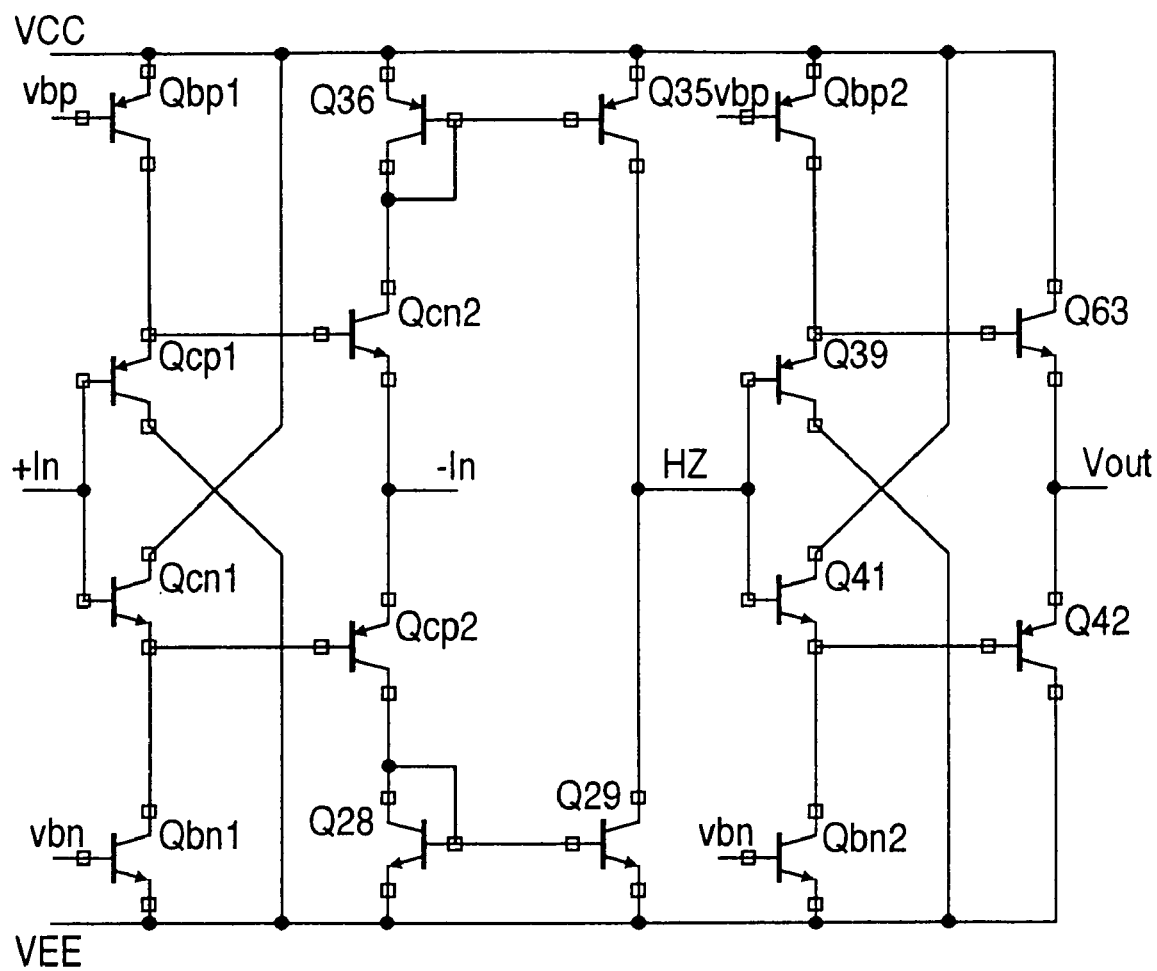
FIG. 1 illustrates one conventional input stage topology that employs a complementary cascaded emitter follower.
Figure 2:
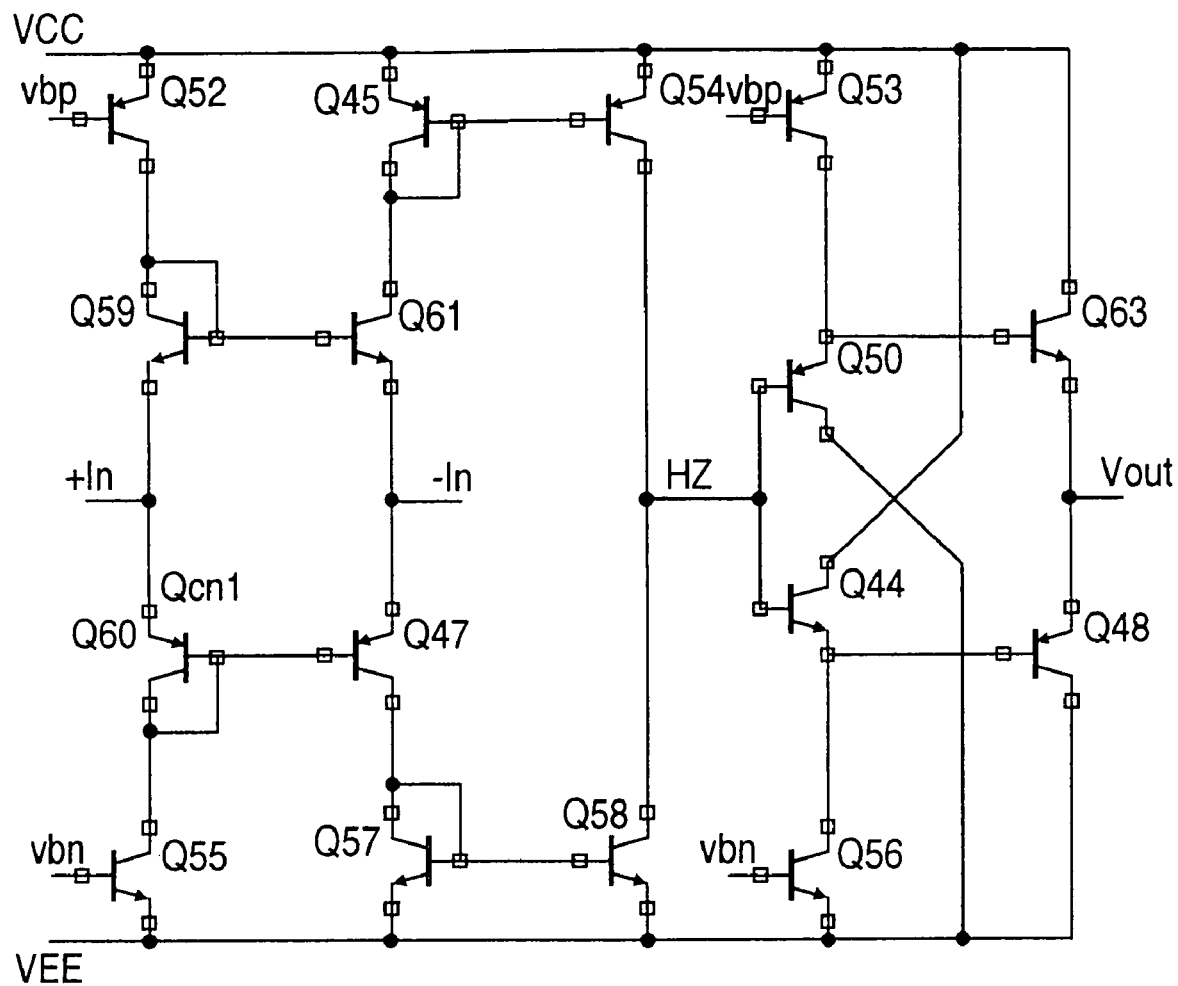
FIG. 2 illustrates another conventional current feedback amplifier input stage that also employs a complementary cascaded emitter follower.
Figure 3:
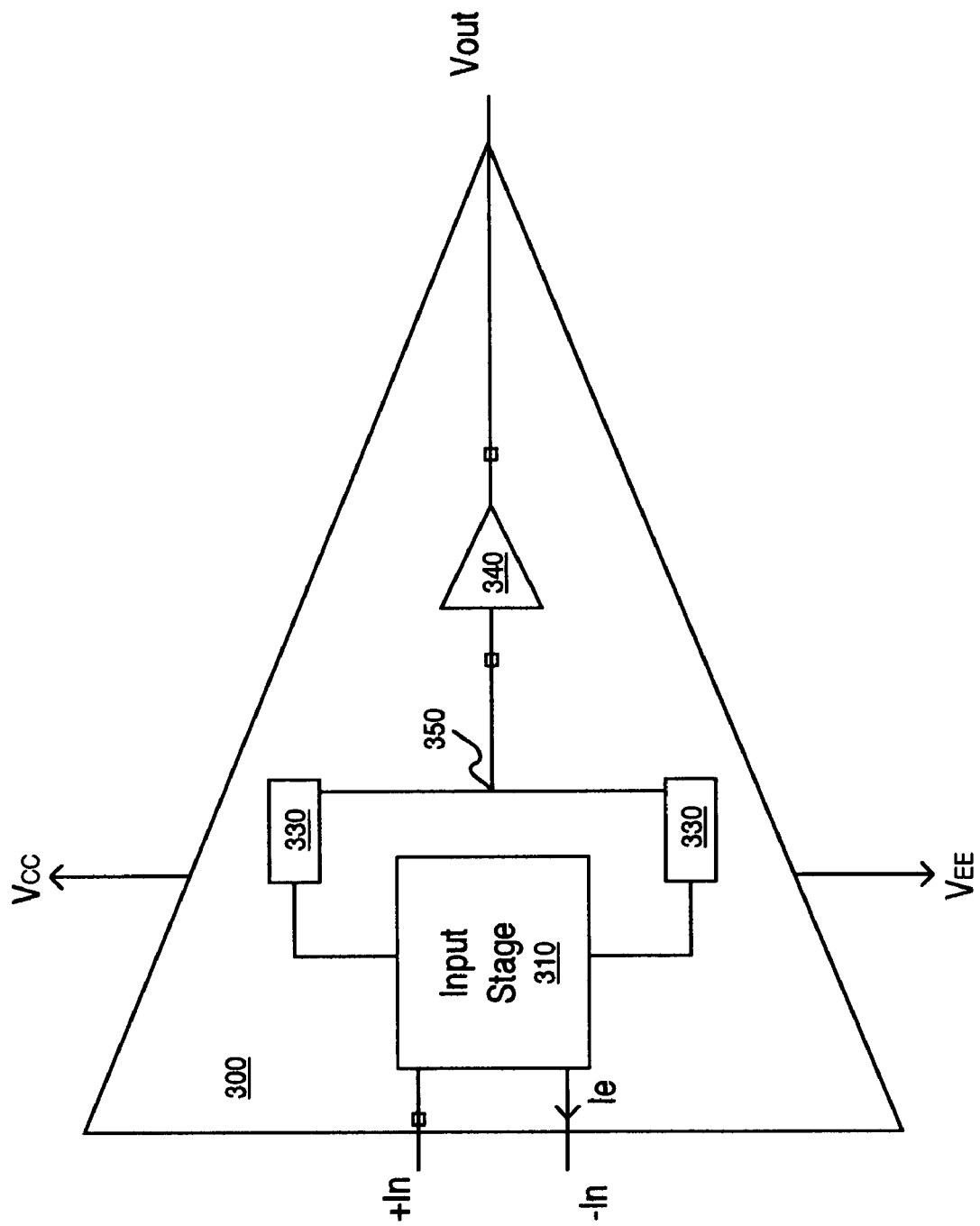
FIG. 3 illustrates a block diagram of a current feedback amplifier, in accordance with various embodiments of the present invention.

FIG. 3 illustrates a block diagram of a current feedback amplifier 300, in accordance with various embodiments of the present invention. The amplifier 300 is coupled to the supply rails $V_{CC}$ and $V_{EE}$ and includes an input stage 310, which generates an error current Ie in response to a voltage differential seen at the inputs +In and −In. The amplifier 300 also includes a pair of current mirrors 330, which mirror respective currents of the input stage 310. The mirrored currents from the current mirrors 330 are then summed into a high impedance node 350, which generates a voltage at the high impedance node 350 that corresponds to the mirrored currents. The amplifier 300 also includes an output stage 340, which is operable to provide gain for the amplifier and to generate the output voltage Vout.

The input stage 310 is advantageously operable to receive voltages at the inputs +In and −In that are closer than 800 mV to either supply rail, which was previously unattainable in conventional current feedback amplifiers. Moreover, in one embodiment, the input stage 310 is configurable to achieve rail to rail performance for the inputs +In and −In. Thus, in one embodiment, the inputs of the amplifier 300 are able to swing within 200 mV of either supply rail. In an exemplary embodiment, the inputs of the amplifier 300 may swing as close as 100 mV from either supply rail. This may be achieved, for example, using MOS architecture.

Similarly, the output stage 340 is advantageously operable to generate a rail to rail output voltage Vout. In other words, in one embodiment, the output of the output stage 340 is able to swing within 200 mV of either supply rail. It is appreciated that the voltage headroom may be further improved to 100 mV by implementing MOS architecture.

Figure 4:
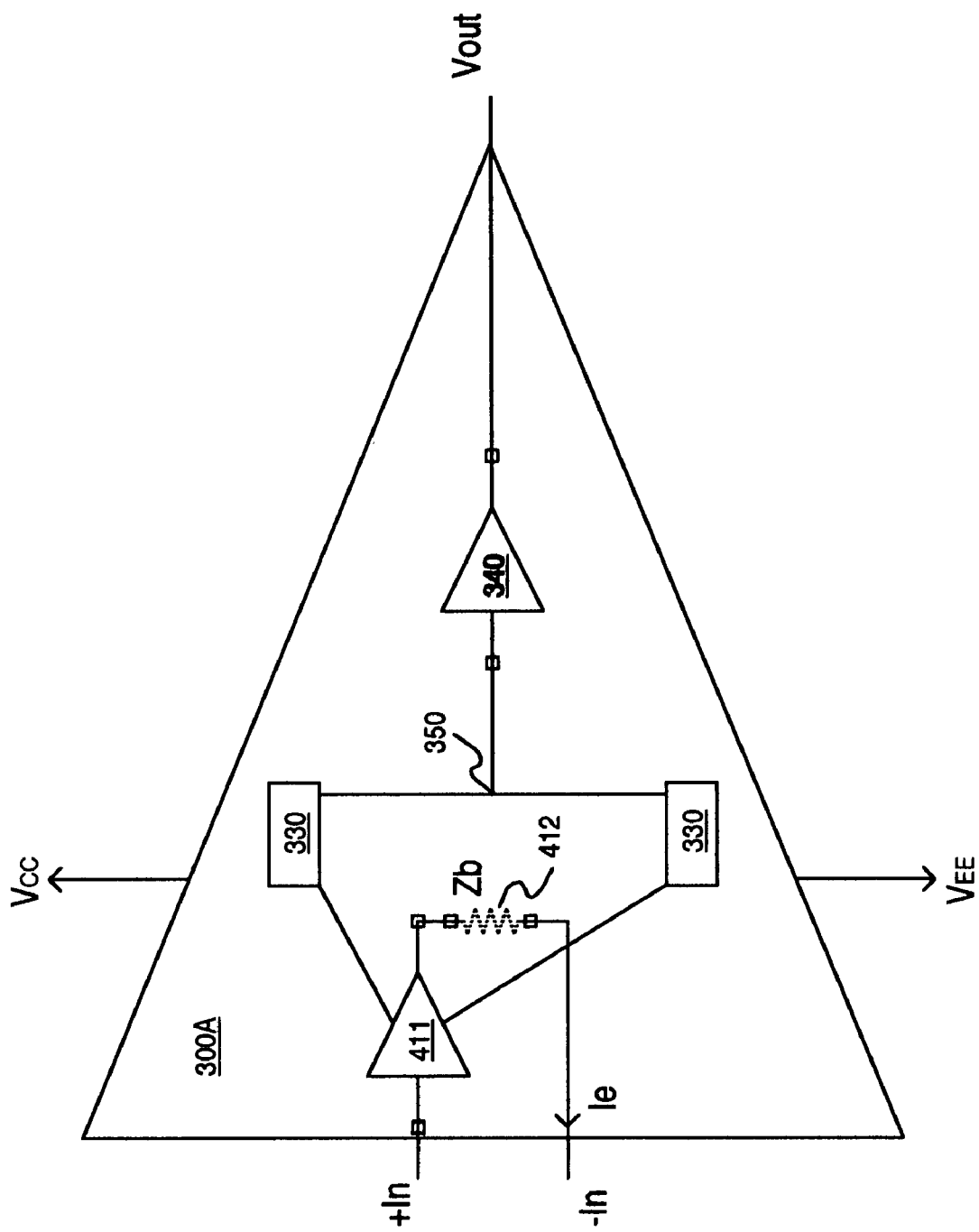
FIG. 4 illustrates a block diagram of a current feedback amplifier, including a closed loop buffer, in accordance with various embodiments of the present invention.

It should be appreciated that the input stage 310 may be achieved a number of ways. For example, FIG. 4 illustrates a block diagram of a current feedback amplifier 300A, including a closed loop buffer 411, in accordance with various embodiments of the present invention. In amplifier 300A, the input stage includes a closed loop buffer 411. It is appreciated that the buffer 411 may have an associated output impedance Zb. For the purposes of illustration, this output impedance is represented by resistor 412. As shown in FIG. 4, the buffer 411 is configured so that an input of the buffer 411 provides a non-inverting input for the amplifier 300A and an output of the buffer 411 provides an inverting input for the amplifier 300A. Thus, both of the input and the output of the buffer 411 are operable to swing closer than 800 mV to either supply rail. Moreover, in one embodiment, the input and the output of the buffer 411 are operable to swing up to 100 mV from either supply rail. In other words, in one embodiment, the buffer 411 is a rail to rail in, rail to rail out (RRIO) buffer.

In one embodiment, the buffer of 411 forces the inverting terminal −In to follow the non-inverting terminal +In. During quiescent operation only a small error current Ie flows through −In. A replica of the error current is summed into the high impedance node 350, via the current mirrors 330, resulting in a voltage. That voltage is then amplified by the output stage gain Ao(s) to the output Vout. The overall transimpedance gain is therefore set by:

$$Z(s) = CM \cdot HZ \cdot Ao(s) = \frac{Vo}{Ie}, \quad (1)$$

where CM represents the gain of the current mirrors 330 and HZ represents the impedance at the high impedance node 350. In Equation 1, the buffer 411 is assumed to have unity gain, and the output impedance Zb(s) of the buffer 411 is assumed to be zero.

Figure 5:
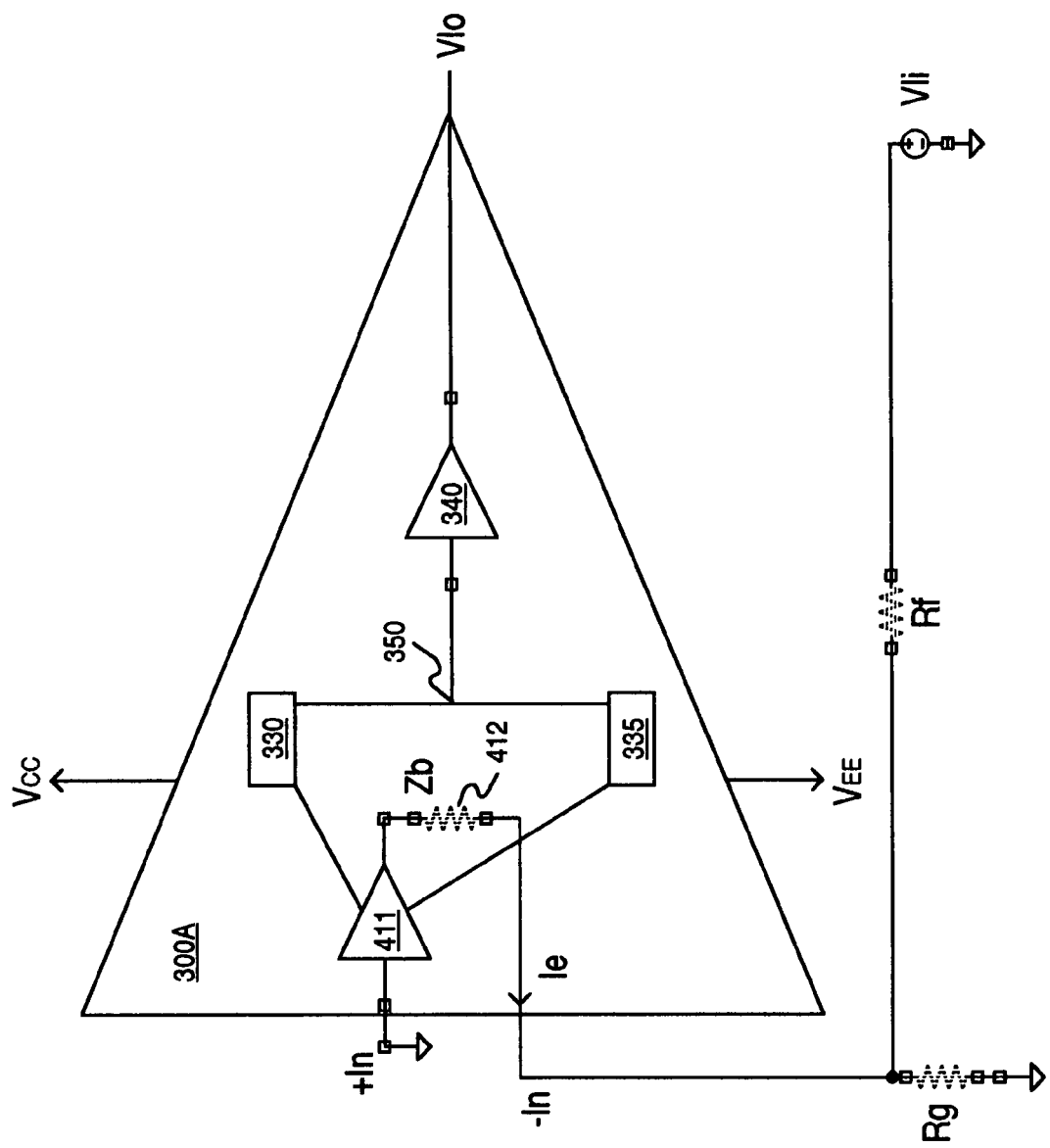
FIG. 5 illustrates a loop gain analysis set-up for the current feedback amplifier of FIG. 4, in accordance with an embodiment of the present invention.

FIG. 5 illustrates a loop gain analysis set-up for the current feedback amplifier 300A of FIG. 4, in accordance with an embodiment of the present invention. As shown in FIG. 5, the feedback loop is broken at the output and a test signal Vli is inserted at the resistor Rf, and the return voltage at the output Vlo is evaluated.

Accordingly, the loop gain is given by the following equation:

$$A\beta(s) = \frac{Vlo}{Vli} = \frac{Z(s)}{Rf \cdot \left(1 + \frac{Zb(s)}{Rf \; // \; Rg}\right)}. \quad (2)$$

The ideal closed loop signal gain is given by:

$$Acl = \frac{Vo}{Vi} = 1 + \frac{Rf}{Rg} \quad (3)$$

The loop gain is mainly determined by Z(s) and Rf, provided Zb(s) is low, and the ideal signal gain is set by the ratio of Rf and Rg. In other words, the ideal signal gain expression is decoupled from the loop gain expression and Rf may be adjusted to maximize bandwidth. It is appreciated that this property relies on Zb(s) being fairly low. If Zb(s) is fairly high, the $$\frac{Zb(s)}{Rf \; // \; Rg}$$

term becomes more of a factor, and the current feedback amplifier 300A may start to behave more like a voltage feedback amplifier, with a fixed gain-bandwidth product.

It therefore follows that, in an exemplary embodiment, the input buffer 411 should have low output impedance Zb(s). Traditional current feedback input buffers are open loop and offer low Zb(s), even at high frequencies. Closed loop buffers can offer low output impedance at low-frequency, but the output impedance increases at higher frequencies when its own internal loop gain starts to decrease because of normal frequency compensation. This can be modeled as:

$$Zb(s)=Rb+s \cdot L, \quad (4)$$

where Rb represents the low-frequency output impedance of the input buffer 411, and L represents the equivalent output inductance of the input buffer 411. The frequency dependent Zb(s) causes an extra non-dominant pole in the overall loop gain and care should be taken to assure the overall stability of the current feedback amplifier 300A.

In one embodiment, the input buffer 411 is operable to drive a parasitic capacitance presented at the inverting node of the amplifier 300A without any stability problems. This may be accomplished, for example, by compensating the buffer 411 by pole-splitting the parasitic capacitance and the poles at the base of the output transistors. To further minimize the effect of parasitic capacitance at the inverting node, a small resistor may be inserted in series.

It is appreciated that pole-splitting may require a fairly large capacitor, which may then limit the slew rate of the input buffer 411, and therefore the whole amplifier 300A. Moreover, isolation with a small series resistor increases the output impedance of the input buffer 411, and the amplifier 300 will behave less like an ideal current feedback amplifier.

Figure 6:
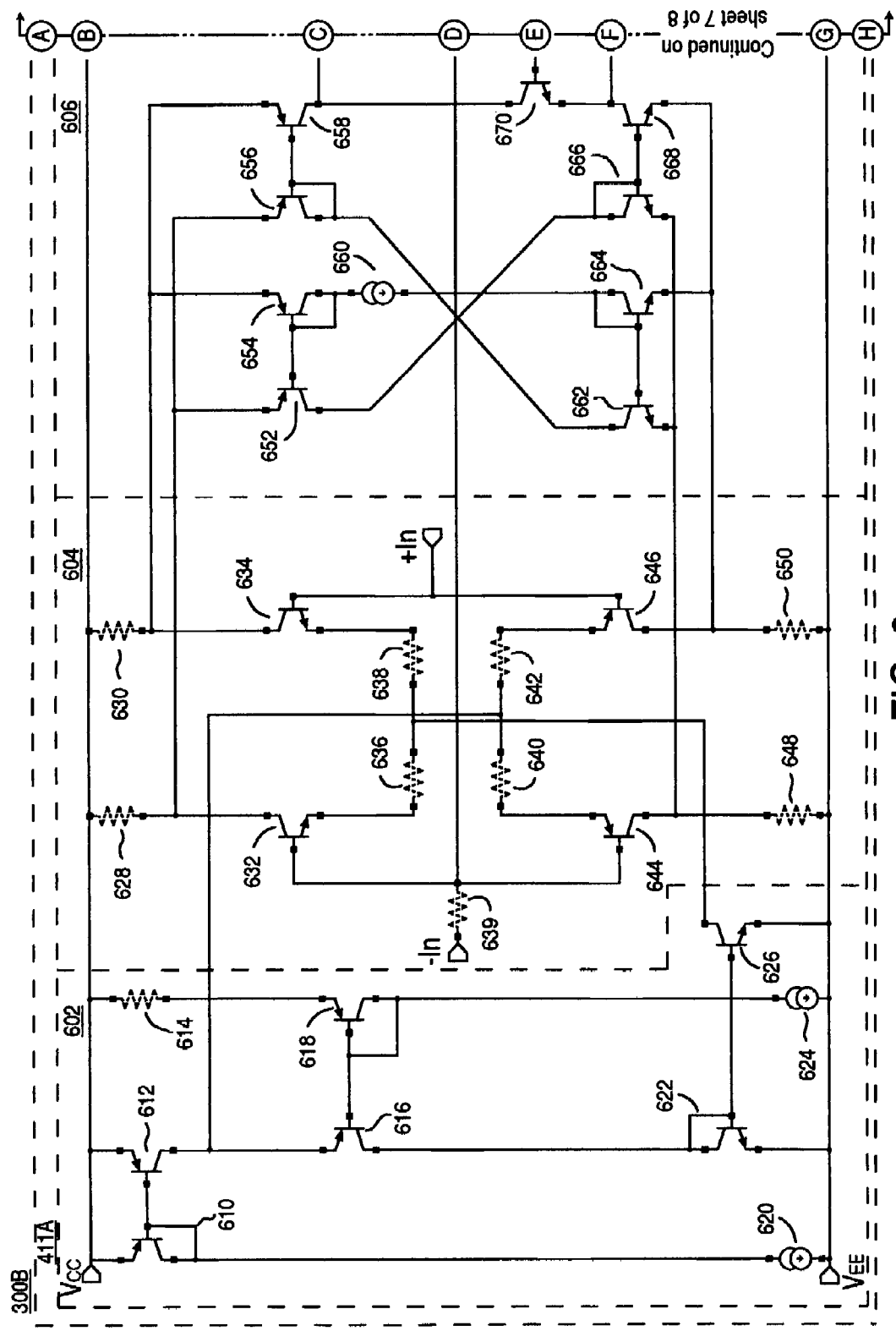
FIG. 6 illustrates an exemplary schematic of a current feedback amplifier, in accordance with various embodiments of the present invention.
Figure 6:
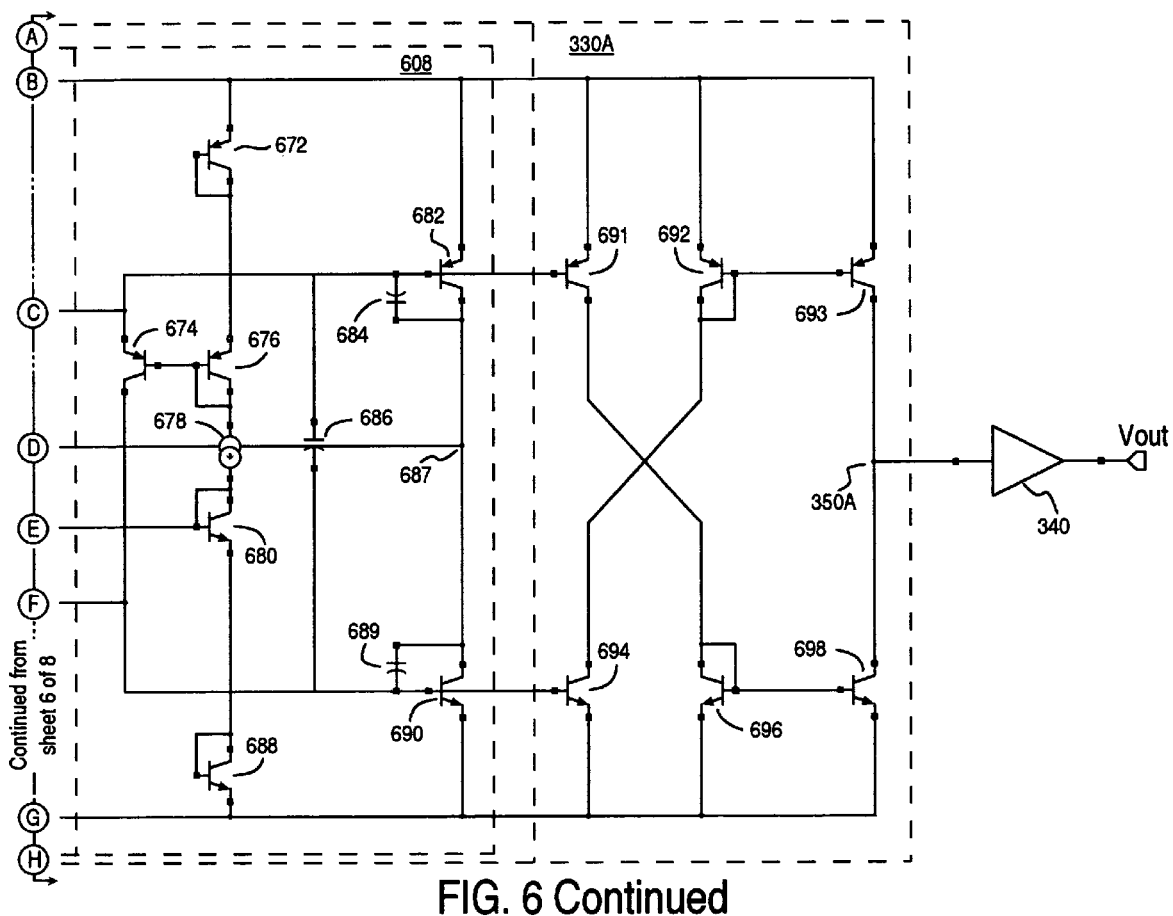

FIG. 6 illustrates an exemplary schematic of a current feedback amplifier 300B, in accordance with various embodiments of the present invention. The amplifier 300B includes a closed loop buffer 411A, which is coupled with a pair of current mirrors 330A, which are coupled with an output stage 340. Although detailed circuitry is illustrated in FIG. 6, such circuitry is exemplary, and embodiments are not limited as such. It should be appreciated that other circuitry may be used to implement the current feedback amplifier 300 as described above. For example, the input stage 310 is not limited to the closed loop buffer 411A of FIG. 6. On the contrary, the input stage 310 may be implemented in any arrangement that is capable of swinging closer than 800 mV to either supply rail. On the same token, amplifiers 300 and 300A may implement MOS architecture, rather than bipolar architecture depicted in FIG. 6.

The buffer 411A includes an input biasing and $g_m$ control circuit 602, a complementary input stage 604, a class AB turn around stage 606, and a class AB output stage 608. This particular topology of the buffer 411A is operable to provide low voltage functionality, low quiescent current, and high-speed performance.

For the purposes of the present discussion, it will be assumed that the amplifier 300B is operating at a common mode voltage sufficient to cause the PNP transistors 644 and 646 to conduct, and that a small positive voltage is applied to the input +In. The positive voltage applied to +In will cause transistor 646 to conduct less current, which causes the voltage across resistor 650 to decrease, which in turn increases the current in transistor 668. This will pull the bases of transistors 690 and 694 lower, while also pulling the bases of transistors 682 and 691 lower, via transistor 670.

Concurrently, transistor 644 will conduct more current, raising the voltage across resistor 648, which in turn lowers the current in transistor 662. This current is mirrored via transistors 656 and 658. The decreased current in transistor 658 delivers less base current drive to transistors 690 and 694 and allows more base current drive for transistors 682 and 691. This will cause the output of the RRIO buffer 411A (e.g., node 687) and the base of transistors 644 to follow the +In input, ensuring a gain of one. It should be appreciated that under conditions where a common mode voltage causes transistors 632 and 634 to conduct, similar but complementary functionality would follow.

Since the RRIO buffer 411A is configured for a gain of one, the output of the RRIO buffer 411A therefore determines how closely the RRIO buffer 411A can reach to the rails, typically within 100 to 200 mV, given a typical Rf of 500Ω to 1 kΩ. For example, the output node 687 of the buffer 411A, which is coupled with the −In input of the buffer 411A, is only constrained by the saturation voltage of transistor 682 with respect to $V_{CC}$ and the saturation voltage of transistor 690 with respect to $V_{EE}$. Ignoring the connection between the buffer output 687 and −In, the CMVR of both the +In and −In inputs is the full supply range of $V_{CC}$-$V_{EE}$. Therefore, with buffer 411A connected in the follower configuration shown in FIG. 6, the saturation voltages of transistors 682 and 690 are also the limiting factors with respect to the supply rails for +In and −In.

The quiescent current in the rail to rail output stage of the buffer 411A is set by current source 678, which sets up voltage references in transistors 672 and 676 and also transistors 680 and 688. These two voltages supply the reference for transistors 674 and 682 and also transistors 670 and 690, and therefore set the quiescent current.

The currents in the output transistors of the RRIO buffer 411A are replicated via transistors 691 and 694, and both are mirrored into the high impedance node 350A. The resulting voltage is then amplified via a regular inverting high-speed rail to rail output stage 340. It should be appreciated that any low-voltage rail to rail output stage 340 can be used, provided it can handle the high-speed and slew rate presented at its inputs.

In one embodiment, the frequency compensation of the RRIO buffer 441A is accomplished with Miller capacitors 684 and 689. Capacitors 684 and 689 provide pole-splitting of the pole at the −In input (which is also coupled with the output of the RRIO buffer 441A) and the poles at the bases of the output transistors 682 and 690. In one embodiment, to further minimize the effect of parasitic capacitance at the −In terminal, a small resistor 639 is coupled between the output 687 of the buffer 411A and the −In input.

Exemplary Operations, in Accordance with Various Embodiments

Figure 7:
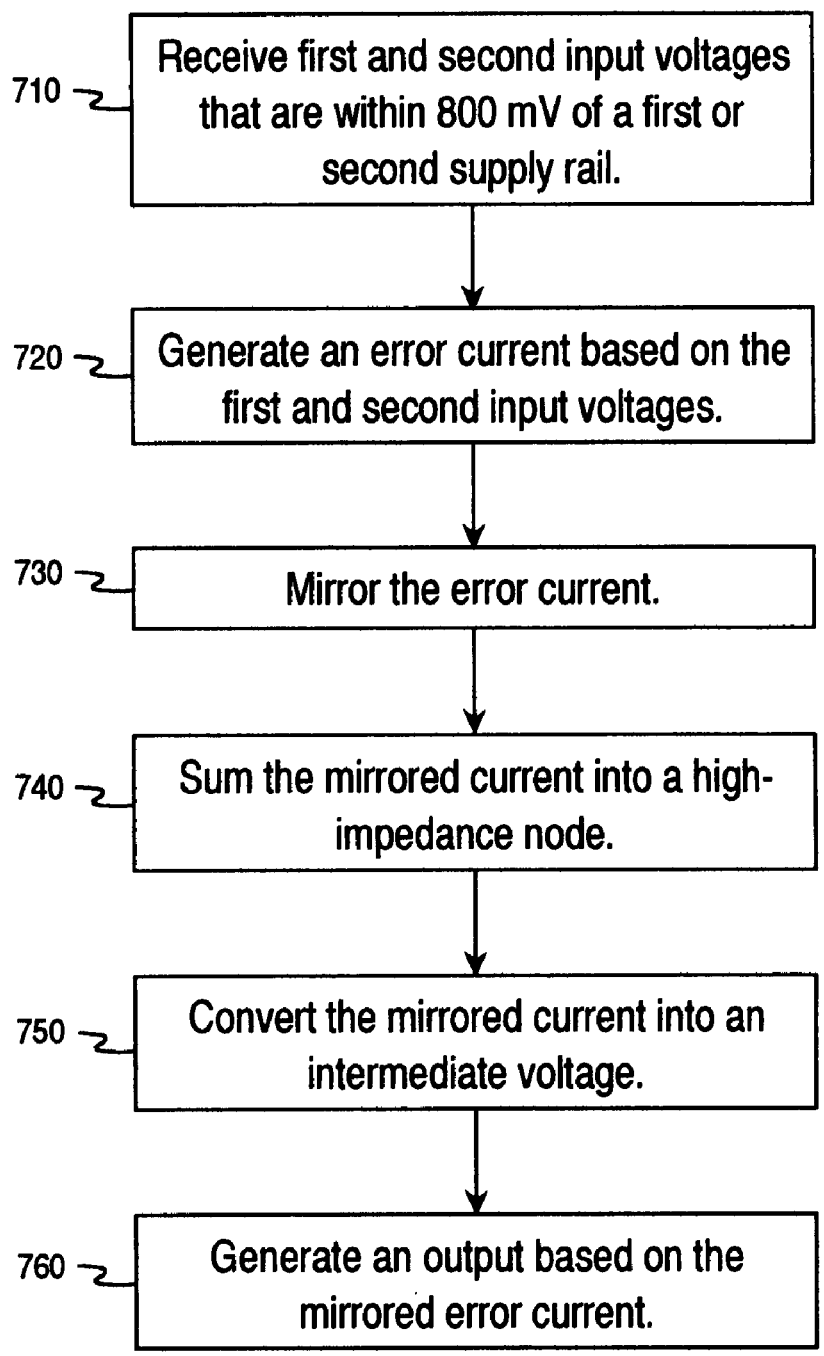
FIG. 7 illustrates a flowchart of current feedback amplifier operation, in accordance with various embodiments of the present invention.

The following discussion sets forth in detail the operation of present technology for current feedback amplifier operation. With reference to FIG. 7, flowchart 700 illustrates example operations used by various embodiments of the present technology for current feedback amplifier operation. Flowchart 700 includes processes that, in various embodiments, are carried out by circuitry in an integrated circuit. Although specific operations are disclosed in flowchart 700, such operations are examples. That is, embodiments are well suited to performing various other operations or variations of the operations recited in flowchart 700. It is appreciated that the operations in flowchart 700 may be performed in an order different than presented, and that not all of the operations in flowchart 700 may be performed.

With reference now to FIG. 7, block 710 involves receiving first and second input voltages that are within 800 mV of a first or second supply rail. In one embodiment, the first and second voltages may be as close as 200 mV to either supply rail. In another embodiment, the first and second voltages may be as close as 100 mV to either supply rail.

At block 720, an error current is generated based on the first and second input voltages. This may be achieved, for example, with a buffer circuit. Block 730 next involves mirroring the error current. At block 740, the mirrored current is summed into a high-impedance node. At block 750, the mirrored current is converted to a corresponding intermediate voltage. At block 760, an output voltage is generated based on the intermediate voltage.

Thus, embodiments provide for a rail to rail current feedback amplifier. Therefore, current feedback amplifiers according to various embodiments may be suitable for use in low-voltage applications (e.g., less than 5 V) in which current feedback amplifiers previously were not due to CMVR constraints. Moreover, various embodiments are capable of accepting common mode signals that are very near to the rails, while at the same time maintaining the traditional current feedback advantages of high slew rate and flexible AC performance.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A current feedback amplifier, wherein said current feedback amplifier is coupleable with a first supply rail and a second supply rail, said current feedback amplifier comprising:
an input stage configurable to provide a first input and a second input for said current feedback amplifier, wherein said first and second inputs are operable to receive input voltages within 800 mV of said first supply rail or said second supply rail, and wherein said input stage comprises an input biasing and conductance control circuit, a complementary input stage, a turn around circuit, and an output circuit in cascade, said complementary input stage comprising:
an NPN transistor pair coupled to said first supply rail and coupled to a second current source of said input biasing and conductance control circuit; and
a PNP transistor pair coupled to said second supply rail and coupled to a first current source of said input biasing and conductance control circuit,
wherein an output node of said input stage is coupled to a node of said second input;
a first current mirror coupled with said input stage;
a second current mirror coupled with said input stage; and
an output stage coupled with said first and second current mirrors, said output stage for providing an output for said current feedback amplifier.

2. The current feedback amplifier as recited in claim 1 wherein said first and second inputs are operable to receive input voltages within 200 mV to 800 mV of said first supply rail or said second supply rail.

3. The current feedback amplifier as recited in claim 1 wherein said first and second inputs are operable to receive input voltages within 100 mV to 800 mV of said first supply rail or said second supply rail.

4. The current feedback amplifier as recited in claim 1 wherein said output stage comprises a rail-to-rail output.

5. The current feedback amplifier as recited in claim 1 wherein said input stage comprises a rail-to-rail input.

6. The current feedback amplifier as recited in claim 1 wherein said input stage comprises a closed loop buffer.

7. The current feedback amplifier as recited in claim 6 wherein said closed loop buffer comprises a rail-to-rail input.

8. The current feedback amplifier as recited in claim 6 wherein said closed loop buffer comprises a rail-to-rail output.

9. The current feedback amplifier as recited in claim 1 wherein a path between said first input and said first supply rail comprises no more than one transistor coupled between said first input and said first supply rail.

10. The current feedback amplifier as recited in claim 9 wherein a path between said first input and said second supply rail comprises no more than one transistor coupled between said first input and said second supply rail.

11. A method for amplifying a signal in a current feedback amplifier coupleable to a first supply rail and a second supply rail, said method comprising:
receiving first and second input voltages to an input stage of said current feedback amplifier, wherein said first and second input voltages are within 800 mV of said first supply rail or said second supply rail;
generating an error current based on said first and second input voltages;
mirroring said error current; and
generating an output based on said mirrored error current, wherein said input stage comprises an input biasing and conductance control circuit, a complementary input stage, a turn around circuit, and an output circuit in cascade, said complementary input stage comprising:
a NPN transistor pair coupled to said first supply rail and coupled to a second current source of said input biasing and conductance control circuit; and
a PNP transistor pair coupled to said second supply rail and coupled to a first current source of said input biasing and conductance control circuit,
wherein an output node of said input stage is coupled to a node of said second input.

12. The method as recited in claim 11 wherein said first and second input voltages are within 200 mV to 800 mV of said first supply rail or said second supply rail.

13. The method as recited in claim 11 wherein said first and second input voltages are within 100 mV to 800 mV of said first supply rail or said second supply rail.

14. A current feedback amplifier, said current feedback amplifier comprising:
  an input stage comprising a closed loop buffer, said closed loop buffer having a rail to rail input that provides a first input for said current feedback amplifier, said closed loop buffer further having a rail to rail output that provides a second input for said current feedback amplifier, and said closed loop buffer comprising an input biasing and conductance control circuit, a complementary input stage, a class AB turn around circuit, and a class AB output circuit, said complementary input stage in cascade including:
    a NPN transistor pair coupled to said first supply rail and coupled to a second current source of said input biasing and conductance control circuit; and
    a PNP transistor pair coupled to said second supply rail and coupled to a first current source of said input biasing and conductance control circuit,
    wherein an output of said closed loop buffer is fed back to said second input;
  a first current mirror coupled with said input stage;
  a second current mirror coupled with said input stage; and
  an output stage coupled with said first and second current mirrors, said output stage for receiving a summed output of said first and second current mirrors and for providing an output for said current feedback amplifier.

15. The current feedback amplifier as recited in claim 14 wherein said rail to rail input and said rail to rail output of said closed loop buffer are operable to receive input voltages up to 100 mV from supply rails of said current feedback amplifier.

16. The current feedback amplifier as recited in claim 14 wherein said output stage comprises a rail-to-rail output.

17. The current feedback amplifier as recited in claim 14 wherein said input stage comprises a rail-to-rail input.

* * * * *